US011907580B2

United States Patent
Liu et al.

(10) Patent No.: US 11,907,580 B2
(45) Date of Patent: Feb. 20, 2024

(54) CORRECTIVE READ OF A MEMORY DEVICE WITH REDUCED LATENCY

(71) Applicant: Micron Technology, Inc., Boise, ID (US)

(72) Inventors: Tao Liu, San Jose, CA (US); Zhengang Chen, San Jose, CA (US); Ting Luo, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 37 days.

(21) Appl. No.: 17/645,683

(22) Filed: Dec. 22, 2021

(65) Prior Publication Data

US 2023/0195381 A1     Jun. 22, 2023

(51) Int. Cl.
*G06F 3/06*     (2006.01)
*G11C 16/26*     (2006.01)
*G11C 16/10*     (2006.01)
*G11C 16/04*     (2006.01)

(52) U.S. Cl.
CPC .......... *G06F 3/0659* (2013.01); *G06F 3/0611* (2013.01); *G06F 3/0679* (2013.01); *G11C 16/10* (2013.01); *G11C 16/26* (2013.01); *G06F 2212/7206* (2013.01); *G11C 16/0483* (2013.01)

(58) Field of Classification Search
CPC .... G06F 3/0659; G06F 3/0611; G06F 3/0679; G06F 2212/7206; G11C 16/10; G11C 16/26; G11C 16/0483
See application file for complete search history.

(56) References Cited

U.S. PATENT DOCUMENTS

| 10,446,237 | B1 * | 10/2019 | Luo | G11C 16/3495 |
| 10,783,978 | B1 * | 9/2020 | Chen | G11C 11/409 |
| 2009/0310408 | A1 * | 12/2009 | Lee | G11C 16/0483 365/185.09 |
| 2014/0281808 | A1 * | 9/2014 | Lam | G11C 29/028 714/763 |

OTHER PUBLICATIONS

L. Shi, K. Wu, M. Zhao, C. J. Xue, D. Liu and E. H. .-M. Sha, "Retention Trimming for Lifetime Improvement of Flash Memory Storage Systems," in IEEE Transactions on Computer-Aided Design of Integrated Circuits and Systems, vol. 35, No. 1, pp. 58-71, Jan. 2016, doi: 10.1109/TCAD.2015.2453369. (Year: 2016).*

* cited by examiner

*Primary Examiner* — Kalpit Parikh
(74) *Attorney, Agent, or Firm* — Holland & Hart LLP

(57) ABSTRACT

Methods, systems, and devices for a corrective read of a memory device with reduced latency are described. A memory system may identify a read error based on accessing a memory device, and may select a trim setting for a performing a corrective read operation based on a data retention condition associated with the accessed memory device. Such a data retention condition may be associated with a data retention duration, or a cross-temperature condition, among other criteria or combinations thereof. In some implementations, the memory system may select from a subset of possible trim settings, which may be associated with relevant process corners. For example, the memory system may select between a first trim setting that is associated with a relatively large cross-temperature and a relatively short data retention duration and a second trim setting that is associated with a relatively small cross-temperature and a relatively long data retention duration.

21 Claims, 5 Drawing Sheets

CORRECTIVE READ OF A MEMORY DEVICE WITH REDUCED LATENCY

FIELD OF TECHNOLOGY

The following relates generally to one or more systems for memory and more specifically to a corrective read of a memory device with reduced latency.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
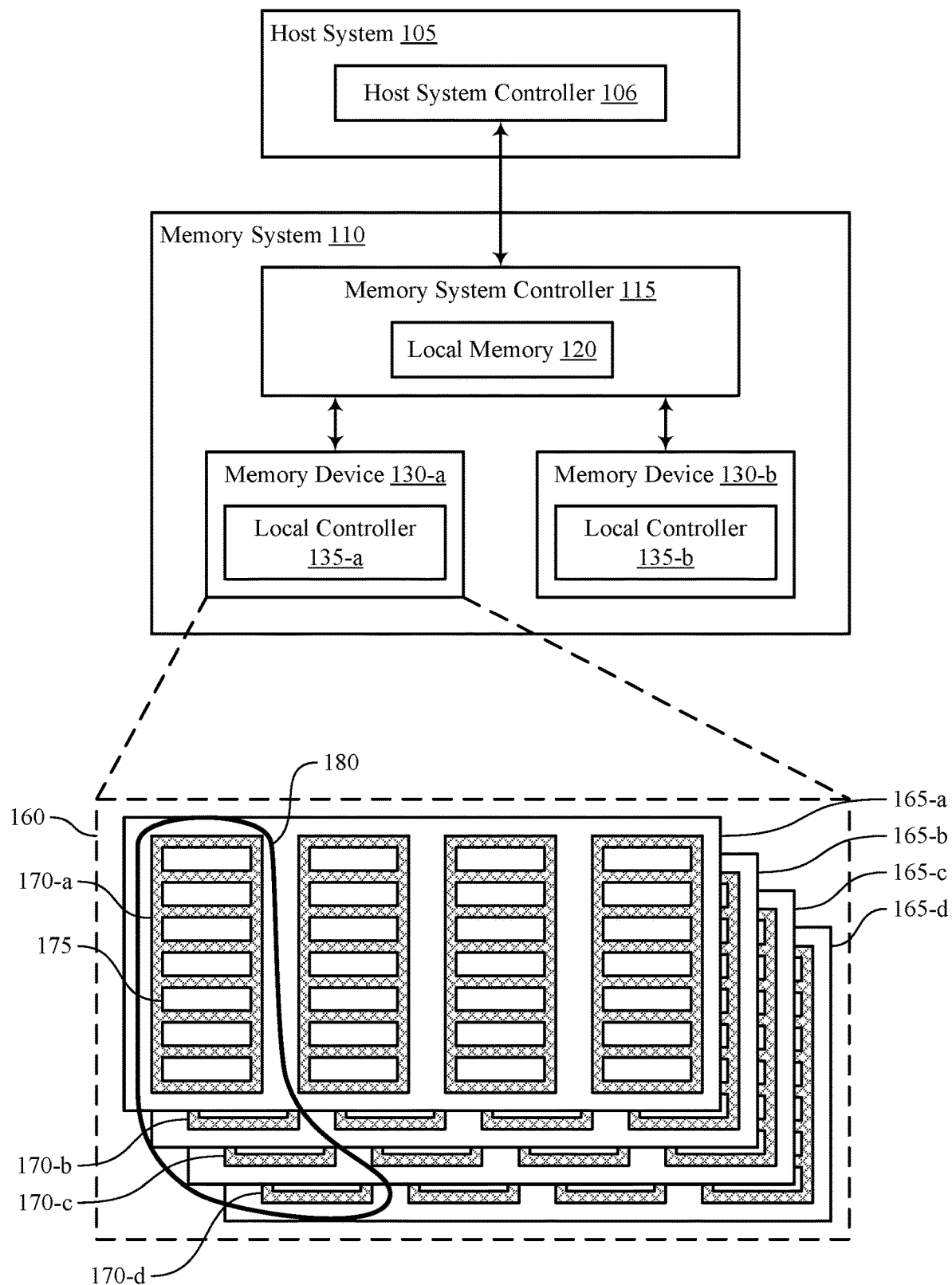
FIG. 1 illustrates an example of a system that supports a corrective read of a memory device with reduced latency in accordance with examples as disclosed herein.

In some implementations, memory systems may be subjected to relatively large ranges of operating conditions, such as a relatively wide range of potential operating temperatures, a relatively large potential temperature difference between access operations (e.g., between write operations and read operations), a relatively large difference in potential data retention durations, and others. For example, in some automotive applications, memory systems may be designed to operate across a temperature range of −40 degrees Celsius to 110 degrees Celsius, and also may be designed to support a full cross-temperature condition, which may involve supporting memory cells being written at one extreme of such a temperature range (e.g., −40 degrees Celsius) and being read at an opposite extreme of such a temperature range (e.g., 110 degrees Celsius). In some examples, supporting a range of operating conditions may involve a set of different trim settings for operating a memory device, such as different read parameters, where some trim settings may be selected from the set based on (or in response to) various criteria. Although a set of different trim settings may be expanded to support acceptable read margins for relatively wide ranges of operating conditions or combinations of operating conditions, in some scenarios, such as corrective read operations (e.g., in response to a detected read error), iteration through a relatively large set of trim settings may be associated with increased latency, power consumption, processing load, or other adverse operation.

In accordance with examples as disclosed herein, a memory system may be configured to support various techniques for improving system efficiency in performing corrective read operations in response to a detected read error (e.g., in accordance with an enhanced corrective read). For example, a memory system may identify a read error based on (or in response to) accessing a memory device and, in response to the identified read error, may select one or more trim settings for a performing a corrective read operation based at least in part on a data retention condition associated with the accessed memory device (e.g., associated with information accessed at the memory device, associated with a physical address accessed at the memory device). In various examples, such a data retention condition may be associated with a data retention duration, or a temperature or cross-temperature condition, among other criteria or combinations thereof.

In some implementations, the memory system may select from a subset of possible trim settings, which may be associated with performing corrective read operations at one or more relevant process corners. For example, the memory system may select between a first trim setting that is associated with a relatively large cross-temperature and a relatively short data retention duration, and a second trim setting that is associated with a relatively small cross-temperature and a relatively long data retention duration. The memory system being able to select between different trim settings may facilitate supporting a suitable balance between read margin reliability and latency associated with performing corrective read operations. For example, if a first corrective read operation associated with one of a first trim setting or a second trim setting is unsuccessful, the memory system may attempt a second corrective read operation associated with the other of the first trim setting or the second trim setting. If the second corrective read operation is unsuccessful, the memory system may infer a relatively high probability of a defect or other relatively severe error, and may proceed with other error handling operations without further corrective read operation attempts. Accordingly, by selecting from among a subset of possible trim parameters, which may represent suitable corners of possible operating conditions or combinations thereof, a memory system may complete a corrective read evaluation relatively quickly, which may reduce latency, power consumption, or processor load associated with error handling operations.

Features of the disclosure are initially described in the context of systems with reference to FIG. 1. Features of the disclosure are described in the context of process flows with reference to FIGS. 2 and 3. These and other features of the disclosure are further illustrated by and described in the context of an apparatus diagram and flowchart that relate to a corrective read of a memory device with reduced latency with reference to FIGS. 4 and 5.

FIG. 1 illustrates an example of a system 100 that supports a corrective read of a memory device with reduced latency in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-$a$ and 130-$b$ are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof.

Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-a may include a local controller 135-a and a memory device 130-b may include a local controller 135-b.

In some cases, a memory device 130 may be or include a NAND device (e.g., NAND flash device). A memory device 130 may be or include a die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170 and, in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-a, 170-b, 170-c, and 170-d that are within planes 165-a, 165-b, 165-c, and 165-d, respectively, and blocks 170-a, 170-b, 170-c, and 170-d may be collectively referred to as a virtual block 180. In some cases, a virtual block may include blocks 170 from different memory devices 130 (e.g., including blocks in one or more planes of memory device 130-a and memory device 130-b). In some cases, the blocks 170 within a virtual block may have the same block address within their respective planes 165 (e.g., block 170-a may be "block 0" of plane 165-a, block 170-b may be "block 0" of plane 165-b, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programmed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

In some cases, to update some data within a block 170 while retaining other data within the block 170, the memory device 130 may copy the data to be retained to a new block 170 and write the updated data to one or more remaining pages of the new block 170. The memory device 130 (e.g., the local controller 135) or the memory system controller 115 may mark or otherwise designate the data that remains in the old block 170 as invalid or obsolete and may update a logical-to-physical (L2P) mapping table to associate the logical address (e.g., LBA) for the data with the new, valid block 170 rather than the old, invalid block 170. In some cases, such copying and remapping may be performed instead of erasing and rewriting the entire old block 170 due to latency or wearout considerations, for example. In some cases, one or more copies of an L2P mapping table may be stored within the memory cells of the memory device 130 (e.g., within one or more blocks 170 or planes 165) for use (e.g., reference and updating) by the local controller 135 or memory system controller 115.

In some cases, L2P mapping tables may be maintained and data may be marked as valid or invalid at the page level of granularity, and a page 175 may contain valid data, invalid data, or no data. Invalid data may be data that is outdated due to a more recent or updated version of the data being stored in a different page 175 of the memory device 130. Invalid data may have been previously programmed to the invalid page 175 but may no longer be associated with a valid logical address, such as a logical address referenced by the host system 105. Valid data may be the most recent version of such data being stored on the memory device 130. A page 175 that includes no data may be a page 175 that has never been written to or that has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support a corrective read of a memory device with reduced latency. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some implementations, a system 100 (e.g., a host system 105, a memory system 110) may be subjected to relatively large ranges of operating conditions, such as a relatively wide range of potential operating temperatures, a relatively large potential temperature difference between access operations (e.g., a relatively large cross-temperature, a relatively large difference between write operations on a memory device 130 and read operations on the memory device 130), a relatively large difference in potential data retention durations (e.g., a duration between write operations on memory cells of a memory device 130 and read operations on the memory cells of the memory device 130), and others. For example, in some automotive applications, a memory system 110 may be designed to operate across a temperature range of −40 degrees Celsius to 110 degrees Celsius, and also may be designed to support a full cross-temperature condition, which may involve supporting memory cells of a memory device 130 being written at one extreme of such a temperature range and being read at an opposite extreme of such a temperature range.

In some examples, supporting a range of operating conditions may involve a set of different trim settings, such as different parameters for performing read operations at a memory device 130, where trim settings may be selected from the set based on (or in response to) various criteria (e.g., based on detected or inferred operating conditions) to support various read operations. In some such examples, such criteria may be associated with a specification stack. For example, a set of different trim settings may be associated with some quantity of elements or parameters, such as temperature or cross-temperature and a data retention duration (e.g., a high-temperature data retention duration, which may be associated with a cumulative duration between write operations and read operations at or above a threshold temperature). In some examples, using a single (e.g., unified) setting for various operating conditions may be undesirable, because such techniques may favor read performance for certain process corners while sacrificing read performance for other process corners. Accordingly, in some examples, trim settings associated with different read temperatures may be implemented at a memory device 130 to improve read performance for different temperature or cross-temperature corners, and trim settings associated with different data retention durations may be implemented at a memory device 130 to improve read performance for different data retention corners. In some implementations, a cross-temperature portion and a data retention portion may be relatively independent, and trim setting selection for such portions may be controlled separately.

In some examples, a memory system 110 may be configured to support corrective read operations, which may refer to various techniques for performing one or more read operations on memory cells of a memory device 130 (e.g., a physical address of memory cells) after identifying an error associated with a preceding read operation on those same memory cells. In some implementations, such techniques may be configured to supplement other read error handling operations performed at a memory device 130, which may leverage processing or other capability outside the memory device 130 (e.g., of a memory system controller 115). For example, a memory device 130 (e.g., a local controller 135) may perform a read operation, and may identify an error based on various error detection or error correction capabilities of the memory device 130. In some examples, the memory device 130 may not resolve such an error, and may indicate the error to a memory system controller 115. In response, the memory system controller 115 may initiate one or more corrective read operations (e.g., via signaling to the memory device 130), which may include the memory system controller 115 selecting and indicating trim settings for the memory device 130 to use in performing the corrective read operations.

Although a set of different trim settings implemented by a memory device 130 may be expanded to support acceptable read margins for relatively wide ranges of operating conditions or combinations of operating conditions, in some scenarios, such as corrective read operations (e.g., in response to a detected read error), iteration through a relatively large set of trim settings may be associated with increased latency, power consumption, processing load, or other adverse operation. In accordance with examples as disclosed herein, a memory system 110 may be configured to support various techniques for improving system efficiency in performing corrective read operations in response to a read error associated with a read operation on a memory device 130 (e.g., in accordance with an enhanced corrective read). For example, a quantity of trim settings used for corrective read operations may be limited (e.g., limited to a subset of the trim parameters implemented at a memory device 130), and a memory system 110 (e.g., a memory system controller 115) may be configured to select a trim setting from the subset based on (or in response to) observed or inferred system conditions. For example, a memory system 110 (e.g., a memory system controller 115) may identify a read error based on (or in response to) accessing a memory device 130 (e.g., based on signaling from the memory device 130) and, in response to the identified read error, may select a trim setting for a performing a corrective read operation on the memory device 130 based at least in part on a data retention condition associated with the accessed memory device 130 (e.g., associated with information accessed at the memory device 130, associated with a physical address accessed at the memory device) 130. In various examples, such a data retention condition may be associated with a data retention duration (e.g., a high-temperature data retention duration), or a temperature or cross-temperature condition, among other criteria or combinations thereof.

In some implementations, the memory system 110 (e.g., the memory system controller 115) may select from a subset of possible trim settings, which may be associated with performing corrective read operations at relevant process corners. For example, the memory system 110 may select between a first trim setting that is associated with a relatively large cross-temperature and a relatively short data retention duration and a second trim setting that is associated with a relatively small cross-temperature and a relatively long data retention duration, which may support a suitable balance between read margin reliability and latency associated with performing corrective read operations. For example, if a first corrective read operation at the memory device 130 performed in accordance with one of a first trim setting or a second trim setting is unsuccessful, the memory system 110 may attempt a second corrective read operation at the memory device 130 in accordance with the other of the first trim setting or the second trim setting. If the second corrective read operation is unsuccessful, the memory system 110 (e.g., the memory system controller 115) may infer a relatively high probability of a defect or other relatively severe error at the memory device 130, and may proceed with other error handling operations (e.g., by the memory system controller 115, by the memory device 130) without further corrective read operation attempts. Accordingly, by selecting from among a subset of possible trim parameters, which may represent or otherwise cover suitable corners of possible operating conditions or combinations thereof, the memory system 110 may complete a corrective read evaluation relatively quickly, which may reduce latency, power consumption, or processor load associated with error handling operations.

Figure 2:
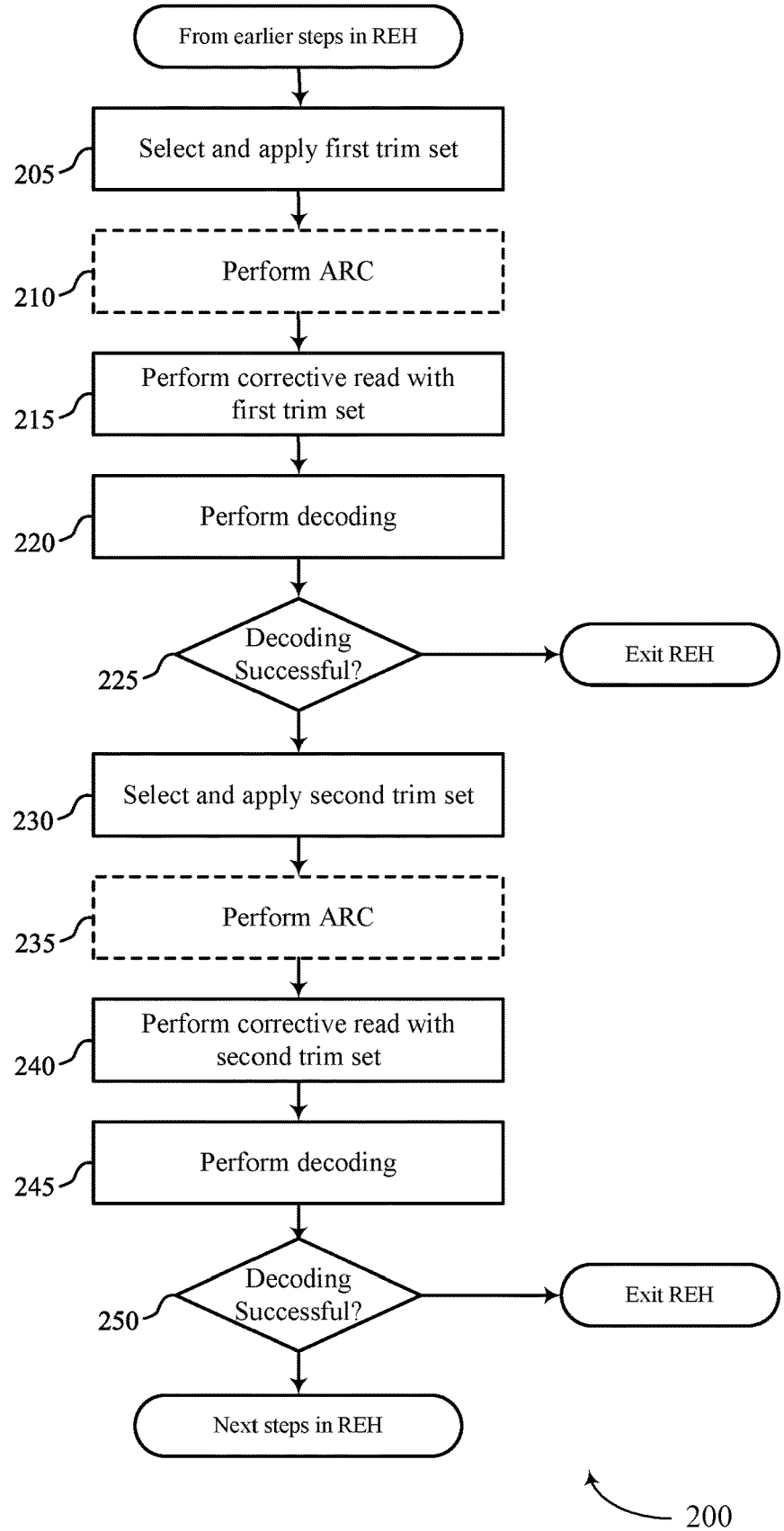
FIG. 2 illustrates an example of a method that supports a corrective read of a memory device with reduced latency in accordance with examples as disclosed herein.

FIG. 2 illustrates an example of a method 200 that supports a corrective read of a memory device with reduced latency in accordance with examples as disclosed herein. Operations of the method 200 may be performed by a memory system 110, such as a memory system controller 115 that is coupled with one or more memory devices 130.

In some examples, the method 200 may include operations performed in response to (e.g., following, initiated based on) earlier steps of a read error handling (REH) operation. For example, a memory device 130 (e.g., a local controller 135) may perform a read operation (e.g., in response to a read command from a host system 105, or without a read command from a host system 105, such as read operations supporting memory management operations within the memory system 110), and the memory device 130 may identify an error with a portion (e.g., a physical address, a page 175) of a die 160 that is being read. In response to the identified error, the memory device 130 may attempt to perform various read error handling operations. For example, the memory device 130 may perform one or more "read retry" operations that include using different predefined read levels (e.g., different read voltages) to re-read the same portion of the die 160. In some examples, the memory device 130 may perform a "read calibration" operation, associated with a finer read level search where, once a suitable read level is identified, a calibration with finer granularity may be performed around that level. In some examples, a consecutive read calibration may be performed at the memory device 130, which may provide more coverage than a single calibration. If such read error handling operations are unable to resolve the identified read error (e.g., such that the memory device 130 is unable to perform a resolving operation), the method 200 may proceed with the operations at 205.

At 205, the method 200 may include selecting and applying a first trim set (e.g., one or more trim settings) for corrective read operations. In some examples, such techniques may be performed by the memory system controller 115, which may be responsive to information (e.g., read information, error information) received from the memory device 130. For example, the memory system controller 115 may be configured to select from a subset of trim settings that are implemented at the memory device 130, or other, more fundamental read parameters, which may be associated with different specification corners. The memory system controller 115 may select the first trim set dynamically (e.g., on the fly), which may reduce error handling latency by identifying a trim setting for corrective read operations that may be applicable to relevant (e.g., current) operating conditions. In some examples, such a selection may be based on (or in response to) detected or inferred operating conditions (e.g., conditions corresponding to the portion of the memory device 130 being accessed in a preceding read operation), such as a data retention condition associated with memory device 130.

In some implementations, a memory system controller 115 may be configured to perform a selection between multiple trim settings for a corrective read operation, which may provide a suitable balance between error handling reliability and latency. In some examples, one trim setting may be associated with a relatively higher cross-temperature corner and a relatively shorter data retention duration corner, and another trim setting may be associated with a relatively lower cross-temperature corner and a relatively longer data retention duration corner. Other trim settings, different than the two discussed here are also contemplated. In some examples, trim settings may be relatively more sensitive to a data retention duration portion than a temperature or cross-temperature portion and, accordingly, a selection between trim settings may be made primarily (e.g., in a weighted selection) based on, and in some cases solely based on, a detection or inference associated with a data retention duration (e.g., associated with the portion of the memory device 130 that is being read). In some examples, such a selection may be performed without involving a detection or inference of operating temperature, since trim settings may be less sensitive to temperatures than data retention durations.

In some examples, the selection of 205 may be made based on supporting information provided by the memory device 130, which the memory system controller 115 may use to infer a condition (e.g., a data retention condition) of the memory device 130. For example, some memory devices 130 (e.g., a memory device 130 implementing a NAND architecture) may leverage a threshold voltage (Vt) characteristic of transistors to store or detect a given logic state. In some examples, a Vt characteristic may shift over time, which may be associated with a data retention duration of the memory device 130 (e.g., a time between when a memory cell was written and a time when a memory cell is being read, a cumulative duration between write operations and read operations where a portion of a die 160 is above a threshold temperature). For example, relatively longer retention durations, or relatively long durations of retaining information at elevated temperatures, may be associated with a relatively greater Vt shift (e.g., from a nominal or as-written condition).

In some examples, a memory device 130 may detect or infer Vt shift information associated with a portion of a die 160, such as during earlier read handling operations (e.g., prior to the operations of 205, during a read retry or read calibration operation). For example, Vt shift for a word line of a die 160 may be estimated once a valley bottom has been found during earlier read error handling operations. In some examples, a Vt shift may correspond to a difference between a Vt level associated with default read levels and a Vt level associated with one or more read retries or read calibrations performed by the memory device 130. The memory device 130 may provide Vt shift information to a memory system controller 115 (e.g., prior to or as part of the operations of 205), which may be used by the memory system controller 115 as a proxy of a data retention duration to support a selection between trim settings. For example, at 205, if an indicated Vt shift is less than a threshold, which may indicate a relatively shorter retention duration, the memory system controller 115 may select a trim setting associated with a relatively higher cross-temperature corner and a relatively shorter data retention duration corner and, if an indicated Vt shift is greater than a threshold, which may indicate a relatively longer retention duration, the memory system controller 115 may select a trim setting associated with a relatively lower cross-temperature corner and a relatively longer data retention duration corner. In an example of the former case, from a set of 10 candidate trims, 5 may be associated with data retention duration, and 5 may be associated with temperature and, in accordance with the selection of 205, the memory system controller 115 may be configured to adjust the trims associated with data retention duration to cover the shorter retention case, and adjust the trims associated with temperature to cover larger cross-temperatures. In some examples, such a selection may improve a likelihood that a subsequent corrective read operation is successful.

In some examples, at 210, the method 200 may include performing an auto-recovery calibration (ARC). The operations at 210 may include calibration operations at the memory device 130, which may be initiated by signaling from the memory system controller 115. For example, as initiated by the memory system controller 115, the memory device 130 may perform a read calibration operation during which the memory device 130 may identify characteristics of a distribution of read voltage levels and corresponding voltage thresholds (e.g., between logic states) for one or more storage levels of the associated memory cells (e.g., in accordance with an SLC configuration, or in accordance with an MLC configuration, among other configurations). The memory device 130 may leverage information of the ARC, such as information related to the read voltage levels or voltage thresholds, to determine an applicable read voltage level for respective storage levels, and an associated offset from a baseline read voltage level. In some examples, once a suitable read level is identified, a calibration with finer granularity may be performed around that level. In some examples, the ARC of 210 may be performed using preferred calibration offsets as identified during earlier read operations (e.g., preceding the operations of 205) performed by the memory device 130. For example, the ARC of 210 may be performed using a minimum syndrome weight read offset associated with the earlier steps in read error handling performed by the memory device 130.

At 215, the method 200 may include performing a corrective read operation with the first trim set (e.g., as selected at 205), which may be associated with a same portion of a die 160 as originally read (e.g., a same physical address associated with the read error handling operations prior to 205). The corrective read operation may be initiated by the memory system controller 115, which may include various signaling to the memory device 130 (e.g., a read command, a read trigger). Such signaling may include an indication of the first trim set as selected at 205, which may include an explicit indication of one or more parameters, or may include an identifier of a set of one or more trim parameters that are stored at the memory device 130, among other examples. In some implementations, such operations may include performing a 2-bit corrective read. In various examples, the corrective read operation of 215 may include the memory device 130 transferring related information (e.g., read information, error information) to the memory system controller 115 for subsequent operations, or subsequent operations may be performed at the memory device 130, or various combinations thereof.

At 220, the method 200 may include performing a decoding operation, which may refer to various operations to decode or otherwise verify the information associated with the corrective read operation (e.g., that the information associated with the portion of the die 160 can be retrieved). In various examples, the decoding of 220 may involve one or more hard bit decoding operations, one or more soft bit decoding operations (e.g., one or more single bit soft bit read (SBSBR) operations), or various combinations thereof. For example, the decoding of 220 may include a first hard bit decoding (e.g., a 1-bit hard decoding (1H)), which may be followed by a combination of a hard bit and soft bit decoding (e.g., a 1H2S decoding, if the 1-bit hard decoding is unsuccessful). In various examples, the decoding may be performed by the memory device 130 or by the memory system controller 115. If performed at the memory device 130, the memory device 130 may transmit signaling to the memory system controller 115 to indicate whether the decoding of 220 was successful.

At 225, the method 200 may include determining whether the decoding of 220 was successful, which may be performed by the memory system controller 115. If the decoding of 220 was successful, which may indicate a successful corrective read operation, the method 200 may conclude, which may be associated with exiting the read error handling operations associated with the memory device 130. If the decoding of 225 was not successful, the method may proceed to 230.

At 230, the method 200 may include selecting and applying a second trim set for performing a second corrective read operation. In some examples, such techniques may be performed by the memory system controller 115. In circumstances where the selection of 205 was made between two trim settings (e.g., based on or in response to a comparison of a Vt shift with a threshold), the selection of 205 may be associated with a selection of one of the two trim settings, and the selection of 230 may be associated with a selection of the other of the two trim settings. In some examples, the operations of 230 may be associated with disabling a corrective read.

In some examples, at 235, the method 200 may include performing a second ARC. The operations at 235 may include calibration operations at the memory device 130, which may be initiated by signaling from the memory system controller 115. For example, as initiated by the memory system controller 115, the memory device 130 may perform a read calibration operation where, once a suitable read level is identified, a calibration with finer granularity may be performed around that level. In some examples, the calibration of 235 may be performed using preferred calibration offsets as identified during earlier read operations (e.g., preceding the operations of 205 or during the operations of 210 or 215) performed by the memory device 130. For example, the ARC of 235 may be performed using a minimum syndrome weight read offset associated with the earlier steps in read error handling performed by the memory device 130, or corrective read operations of 215, or a combination thereof.

At 240, the method 200 may include performing a corrective read operation with the second trim set (e.g., as selected at 230), which may be associated with a same portion of a die 160 as originally read (e.g., a same physical address associated with the read error handling operations prior to 205). The corrective read operation may be initiated by the memory system controller 115, which may include various signaling to the memory device 130, which may include an indication of the second trim set. In some implementations, such operations may include performing a 2-bit corrective read. In various examples, the corrective read operation of 240 may include the memory device 130 transferring related information to the memory system controller 115 for subsequent operations, or subsequent operations may be performed at the memory device 130, or various combinations thereof.

At 245, the method 200 may include performing a decoding operation in an effort to decode or otherwise verify the information associated with the second corrective read operation. In various examples, the decoding may be performed by the memory device 130 or by the memory system controller 115. If performed at the memory device 130, the memory device 130 may transmit signaling to the memory system controller 115 to indicate whether the decoding of 245 was successful.

At 250, the method 200 may include determining whether the decoding of 245 was successful, which may be performed by the memory system controller 115. If the decoding of 245 was successful, which may indicate a successful corrective read operation, the method 200 may conclude, which may be associated with exiting the read error handling operations associated with the memory device 130. If the decoding of 245 was not successful, the method 200 also may conclude, which may be associated with performing subsequent read error handling operations. In some examples, such operations may include performing further corrective read operations, but at a finer granularity, and may include using redundancy information to recover lost data. In some examples, such operations may include defect management operations (e.g., where the unsuccessful decoding of 245 may indicate a physical defect), such as refreshing, restoring, or retiring an associated portion of a die 160.

Figure 3:
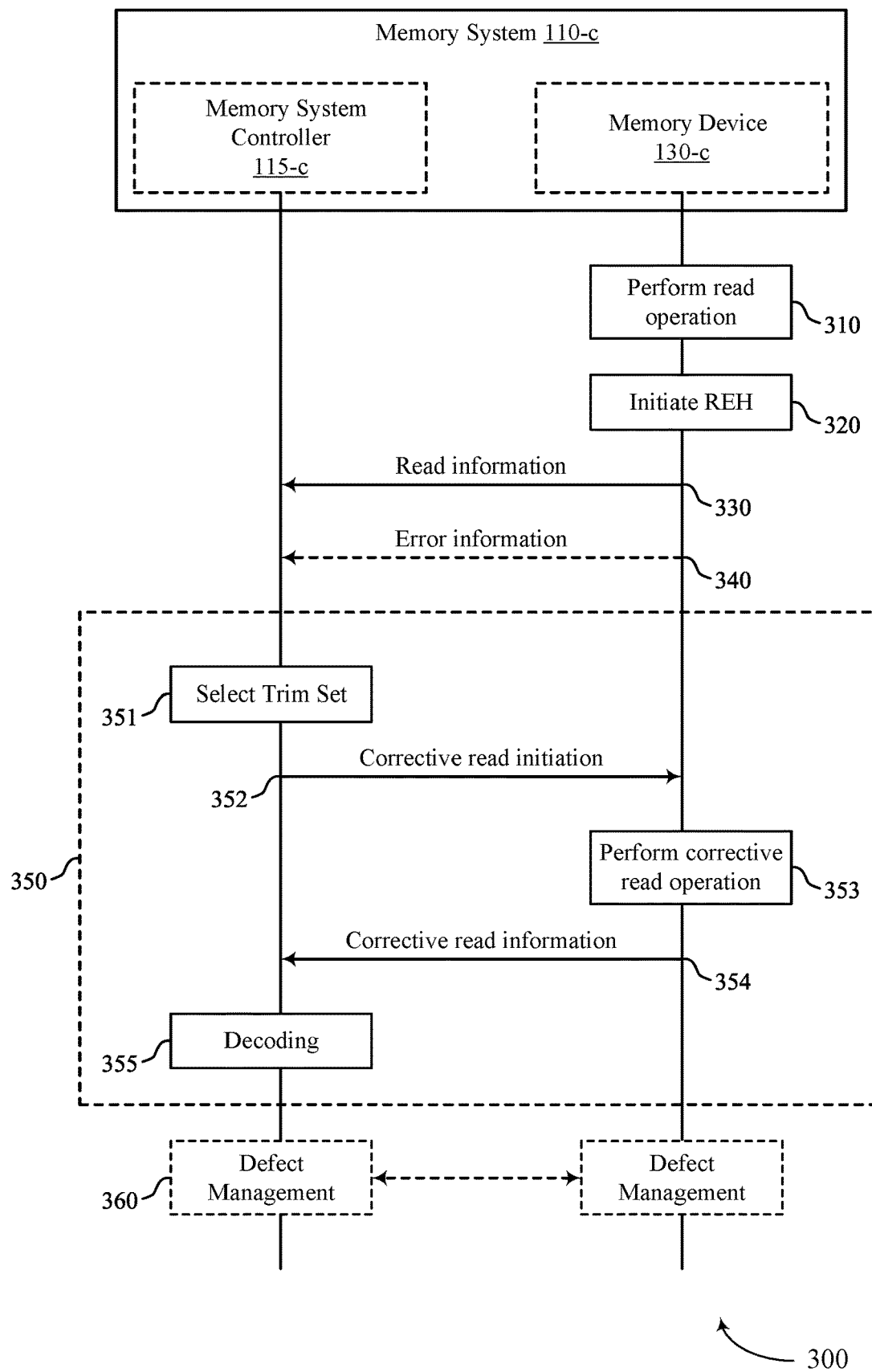
FIG. 3 illustrates an example of a process flow and related signaling that supports a corrective read of a memory device with reduced latency in accordance with examples as disclosed herein.

FIG. 3 illustrates an example of a process flow 300 that supports a corrective read of a memory device with reduced latency in accordance with examples as disclosed herein. Operations of the process flow 300 may be performed by one or more components of a memory system 110-c, such as a memory system controller 115-c and a memory device 130-c, which may be examples of the respective components described with reference to FIGS. 1 and 2.

At 310, the process flow 300 may include performing a read operation, for example by the memory device 130-c (e.g., a local controller 135). In some examples, the read operation of 310 may be performed in response to a read command issued by a host system 105 (not shown), or performed as part of memory management operations by the memory system controller 115-c. In some such examples, the read operation of 310 may be initiated based on or in response to a signal (e.g., read initiation signaling) communicated by the memory system controller 115-*c* and received by the memory device 130-*c*. In some other examples, the read operation of 310 may be initiated autonomously by memory management operations of the memory device 130-*c* (e.g., without an initiating signal from the memory system controller 115-*c*).

At 320, the process flow 300 may include initiating read error handling operations. For example, the memory device 130-*c* (e.g., a local controller 135) may identify a read error associated with the read operation of 310, and may initiate the read error handling operations of 320 (e.g., at the memory device 130-*c*). In some examples, the read error handling of the memory device 130-*c* may be successful, which may avoid one or more aspects of subsequent error handling (e.g., avoiding a corrective read operation, exiting or terminating the process flow 300). In some other examples, the read error handling of the memory device 130-*c* may be unsuccessful, which may be associated with proceeding with subsequent operations of the process flow 300.

At 330 (e.g., in response to the read error handling operations of 320 being unsuccessful), the process flow 300 may include transmitting read information, for example by the memory device 130-*c*, which may be received by the memory system controller 115-*c*. In some examples, the read information of 330 may be associated with the read operation of 310, and may include erroneous read information that was unable to be decoded or corrected by the memory device 130-*c*. In various examples, the read information of 330 may include an application of one or more levels of error correction, or may be unmodified from the read operation of 310 or the read error handling of 320. In some examples, the read information of 330 may be an output associated with one or more read retry operations or read calibration operations associated with the read error handling operations of 330.

In some examples, at 340, the process flow 300 may include communicating error information associated with the read error handling of 320. In some examples, the error information of 340 may include an indication that the read information 330 was not successfully decoded or otherwise validated. In some examples, the error information of 340 may include error identifying information, such as a quantity of errors, a characteristic or category of errors, or an indication of one or more parameters of the read operation of 310 or the read error handling of 320 (e.g., an indication of one or more operating conditions, such as temperature, cross temperature, or voltage, among others). In some examples, the error information of 340 may include an indication of a Vt shift, which may be used to infer a data retention condition of the memory device 130-*c* associated with the read operation of 310 (e.g., to infer a data retention duration associated with a physical address of the memory device 130-*c*, such as a page 175 of the memory device 130-*c*.

At 350 (e.g., in response to receiving the read information of 330, or the error information of 340, or both, or otherwise in response to identifying a read error associated with the read operation of 310), the process flow 300 may include performing one or more corrective read operations. The corrective read operations of 350 may include one or more operations initiated or otherwise managed by the memory system controller 115-*c*, and may include more advanced, more versatile, or more processor-intensive operations than the read error handling operations of 320 (e.g., to leverage a processing or other capability of the memory system controller 115-*c*).

In some examples, at 351, a trim set for the corrective read operations may be selected, for example by the memory system controller 115-*c*, which may include a selection based on (or in response to) a data retention condition associated with the read information of 330 or the error information of 340. For example, the selection at 351 may be based on (or in response to) a data retention duration, or a temperature (e.g., a read temperature, a cross-temperature), or a combination thereof which, in some examples, may be signaled in the read information 330 or the error information of 340. In some examples, the selection of 351 may be based on Vt shift information signaled by the memory device 130-*c*, which may be associated with an inference of a data retention duration corresponding to the read information 330. In some examples, the selection of 351 may be associated with a selection between two trim sets, where a first trim set may be associated with a relatively shorter data retention duration and a second trim set may be associated with a relatively longer data retention duration. In some examples, the selection of 351 may be based on an inference of a data retention duration, but may also be associated with an assumption regarding temperature or cross-temperature (e.g., to evaluate worst-case or otherwise bounding process corners). For example, the first trim set also may be associated with a relatively higher temperature or cross-temperature, and the second trim set may also be associated with a relatively lower temperature or cross-temperature.

In some examples, at 352, a corrective read operation may be initiated, for example by the memory system controller 115-*c*, which may be associated with initiation signaling that may be received by the memory device 130-*c*. In various examples, the initiation of 352 may include an implicit indication or an explicit indication of one or more read parameters associated with the selection of 351 for performing the corrective read operation.

In some examples, at 353, a corrective read operation may be performed, for example by the memory device 130-*c* (e.g., a local controller 135), in accordance with the trim set selected at 315, as initiated by the memory system controller 115-*c*. In some examples, at 354, the memory device 130-*c* may transmit corrective read information (e.g., read information associated with the corrective read operation of 353), which may be received by the memory system controller 115-*c*.

In some examples, at 355, a component, such as the memory system controller 115-*c*, may attempt to decode the corrective read information of 354. If the decoding of 355 is successful, the process flow 300 may end, and the memory system 110-*c* may proceed with normal operations (e.g., processing the decoded read information, which may include transmitting the read information to a requesting host system 105 or otherwise processing the read information to support memory management or other operations). In some examples, if the decoding of 355 is unsuccessful, the corrective read operations of 350 may be repeated. For example, in supporting a selection between two trim sets, the operations of 351 through 355 may be repeated for a second trim set (e.g., in accordance with a trim set that was not selected during a first iteration of 351). In some other examples (e.g., if corrective read operations are performed for only a single selected trim set, or if preceding corrective read operations have been performed for a configured quantity of repetitions), the process flow 300 may conclude the corrective read operations of 350 and proceed with the operations of 360.

At 360, the process flow 300 may include performing defect management operations. In some examples, the defect management operations of 360 may include the memory device 130-c performing further corrective read operations, but at a finer granularity, and may include using redundancy information (e.g., of the memory device 130-c, of another memory device 130) to recover lost data. In some examples, such operations may include defect management operations (e.g., where the unsuccessful decoding of one or more iterations of 355 may indicate a physical defect), such as refreshing, restoring, or retiring an associated portion of a die 160, which may be performed by the memory system controller 115-c, by the memory device 130-c, or both.

Figure 4:
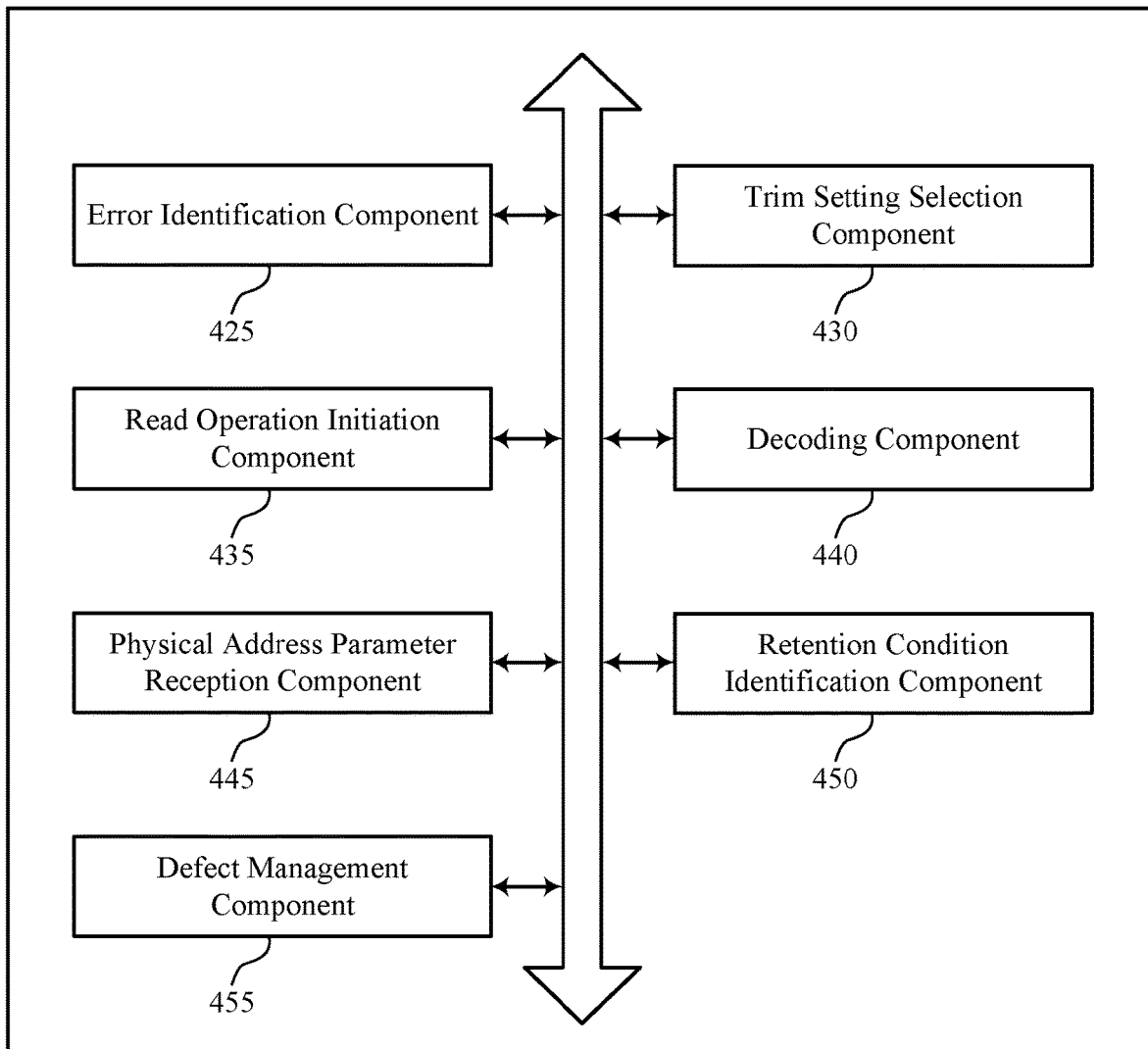
FIG. 4 shows a block diagram of a memory system that supports a corrective read of a memory device with reduced latency in accordance with examples as disclosed herein.

FIG. 4 shows a block diagram 400 of a memory system 420 that supports a corrective read of a memory device with reduced latency in accordance with examples as disclosed herein. The memory system 420 may be an example of aspects of a memory system as described with reference to FIGS. 1 through 3. The memory system 420, or various components thereof, may be an example of means for performing various aspects of a corrective read of a memory device with reduced latency as described herein. For example, the memory system 420 may include an error identification component 425, a trim setting selection component 430, a read operation initiation component 435, a decoding component 440, a physical address parameter reception component 445, a retention condition identification component 450, a defect management component 455, or any combination thereof. Each of these components may communicate, directly or indirectly, with one another (e.g., via one or more buses). In some implementations, the error identification component 425, the trim setting selection component 430, the read operation initiation component 435, the decoding component 440, the physical address parameter reception component 445, the retention condition identification component 450, and the defect management component 455 may be components of a memory system controller 115, which may be coupled with one or more memory devices 130 as described with reference to FIG. 1

The error identification component 425 may be configured as or otherwise support a means for identifying a read error based at least in part on receiving, from a memory device, first information that is associated with a first read operation of the memory device. In some examples, the trim setting selection component 430 may be configured as or otherwise support a means for selecting a trim setting from a plurality of trim settings based at least in part on identifying a data retention condition associated with the first information. In some examples, the read operation initiation component 435 may be configured as or otherwise support a means for transmitting, to the memory device, an indication to initiate a second read operation of the memory device in accordance with the selected trim setting. In some examples, the decoding component 440 may be configured as or otherwise support a means for performing a decoding operation based at least in part on receiving, from the memory device, second information that is associated with the second read operation of the memory device.

In some examples, the physical address parameter reception component 445 may be configured as or otherwise support a means for receiving an indication of a threshold voltage shift associated with a physical address of the memory device for the first read operation. In some examples, the retention condition identification component 450 may be configured as or otherwise support a means for identifying the data retention condition based at least in part on the threshold voltage shift.

In some examples, to select the trim setting, the trim setting selection component 430 may be configured as or otherwise support a means for selecting between a first trim setting that is associated with a first data retention duration and a second trim setting that is associated with a second data retention duration that is greater than the first data retention duration. In some examples, the first trim setting may be associated with a first temperature difference between one or more write operations and one or more read operations and the second trim setting may be associated with a second temperature difference between one or more write operations and one or more read operations that is less than the first temperature difference.

In some examples, transmitting the indication to initiate the second read operation may be associated with a selected one of the first trim setting or the second trim setting. In some such examples, the read operation initiation component 435 may be configured as or otherwise support a means for transmitting, to the memory device based at least in part on the decoding operation being unsuccessful, an indication to initiate a third read operation of the memory device in accordance with the other of the first trim setting or the second trim setting. In some such examples, the decoding component 440 may be configured as or otherwise support a means for performing a second decoding operation based at least in part on receiving, from the memory device, third information that is associated with the third read operation of the memory device.

In some examples, the defect management component 455 may be configured as or otherwise support a means for performing a defect management operation based at least in part on the second decoding operation being unsuccessful. In some examples, performing the decoding operation may include performing a hard bit decoding, a soft bit decoding, or any combination thereof.

Figure 5:
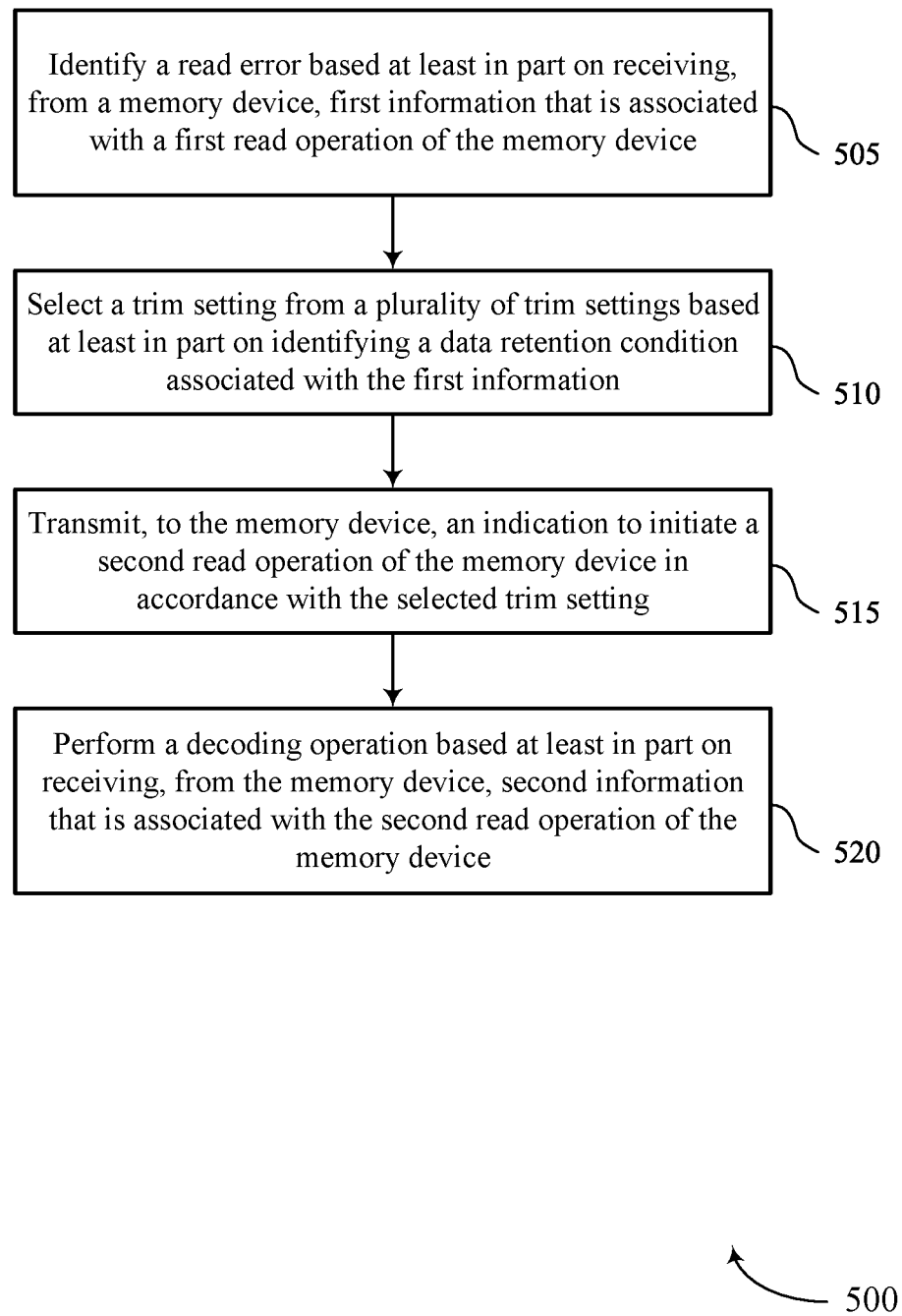
FIG. 5 shows a flowchart illustrating a method or methods that support a corrective read of a memory device with reduced latency in accordance with examples as disclosed herein.

FIG. 5 shows a flowchart illustrating a method 500 that supports a corrective read of a memory device with reduced latency in accordance with examples as disclosed herein. The operations of method 500 may be implemented by a memory system or its components as described herein. For example, the operations of method 500 may be performed by a memory system as described with reference to FIGS. 1 through 4. Aspects of the method 500 may be implemented by a controller, among other components. Additionally or alternatively, aspects of the method 500 may be implemented as instructions stored in memory (e.g., firmware stored in a memory coupled with or otherwise included a memory system 110, instructions stored in local memory 120). For example, the instructions, when executed by a controller (e.g., a memory system controller 115), may cause the controller to perform the operations of the method 500. Additionally or alternatively, the memory system 110 may perform aspects of the described functions using special-purpose hardware.

At 505, the method may include identifying a read error based at least in part on receiving, from a memory device, first information that is associated with a first read operation of the memory device. The operations of 505 may be performed in accordance with examples as disclosed herein. In some examples, aspects of the operations of 505 may be performed by an error identification component 425 as described with reference to FIG. 4.

At 510, the method may include selecting a trim setting from a plurality of trim settings based at least in part on identifying a data retention condition associated with the first information. The operations of 510 may be performed in accordance with examples as disclosed herein. In some examples, aspects of the operations of 510 may be performed by a trim setting selection component 430 as described with reference to FIG. 4.

At 515, the method may include transmitting, to the memory device, an indication to initiate a second read operation of the memory device in accordance with the selected trim setting. The operations of 515 may be performed in accordance with examples as disclosed herein. In some examples, aspects of the operations of 515 may be performed by a read operation initiation component 435 as described with reference to FIG. 4.

At 520, the method may include performing a decoding operation based at least in part on receiving, from the memory device, second information that is associated with the second read operation of the memory device. The operations of 520 may be performed in accordance with examples as disclosed herein. In some examples, aspects of the operations of 520 may be performed by a decoding component 440 as described with reference to FIG. 4.

In some examples, an apparatus as described herein may perform a method or methods, such as the method 500. The apparatus may include, features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for identifying a read error based at least in part on receiving, from a memory device, first information that is associated with a first read operation of the memory device; selecting a trim setting from a plurality of trim settings based at least in part on identifying a data retention condition associated with the first information; transmitting, to the memory device, an indication to initiate a second read operation of the memory device in accordance with the selected trim setting; and performing a decoding operation based at least in part on receiving, from the memory device, second information that is associated with the second read operation of the memory device.

Aspect 2: The method, apparatus, or non-transitory computer-readable medium of aspect 1, further including operations, features, circuitry, logic, means, or instructions, or any combination thereof for receiving an indication of a threshold voltage shift associated with a physical address of the memory device for the first read operation and identifying the data retention condition based at least in part on the threshold voltage shift.

Aspect 3: The method, apparatus, or non-transitory computer-readable medium of any of aspects 1 through 2 where selecting the trim setting includes operations, features, circuitry, logic, means, or instructions, or any combination thereof for selecting between a first trim setting that is associated with a first data retention duration and a second trim setting that is associated with a second data retention duration that is greater than the first data retention duration.

Aspect 4: The method, apparatus, or non-transitory computer-readable medium of aspect 3, where the first trim setting is associated with a first temperature difference between one or more write operations and one or more read operations and the second trim setting is associated with a second temperature difference between one or more write operations and one or more read operations that is less than the first temperature difference.

Aspect 5: The method, apparatus, or non-transitory computer-readable medium of any of aspects 3 through 4 where transmitting the indication to initiate the second read operation is associated with a selected one of the first trim setting or the second trim setting, and where the method, apparatuses, and non-transitory computer-readable medium further includes operations, features, circuitry, logic, means, or instructions, or any combination thereof for transmitting, to the memory device based at least in part on the decoding operation being unsuccessful, an indication to initiate a third read operation of the memory device in accordance with the other of the first trim setting or the second trim setting and performing a second decoding operation based at least in part on receiving, from the memory device, third information that is associated with the third read operation of the memory device.

Aspect 6: The method, apparatus, or non-transitory computer-readable medium of aspect 5, further including operations, features, circuitry, logic, means, or instructions, or any combination thereof for performing a defect management operation based at least in part on the second decoding operation being unsuccessful.

Aspect 7: The method, apparatus, or non-transitory computer-readable medium of any of aspects 1 through 6, where performing the decoding operation includes operations, features, circuitry, logic, means, or instructions, or any combination thereof for performing the decoding operation includes performing a hard bit decoding, a soft bit decoding, or any combination thereof.

It should be noted that the methods described above describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 8: An apparatus, including: a memory device; and a controller coupled with the memory device and configured to cause the apparatus to: identify a read error based at least in part on receiving, from the memory device, first information that is associated with a first read operation of the memory device; select a trim setting from a plurality of trim settings based at least in part on identifying a data retention condition associated with the first information; transmit, to the memory device, an indication to initiate a second read operation of the memory device in accordance with the selected trim setting; and perform a decoding operation based at least in part on receiving, from the memory device, second information that is associated with the second read operation of the memory device.

Aspect 9: The apparatus of aspect 8, where the controller is further configured to cause the apparatus to: receive an indication of a threshold voltage shift associated with a physical address of the memory device for the first read operation; and identify the data retention condition based at least in part on the threshold voltage shift.

Aspect 10: The apparatus of any of aspects 8 through 9, where, to select the trim setting, the controller is configured to cause the apparatus to: select between a first trim setting that is associated with a first data retention duration and a second trim setting that is associated with a second data retention duration that is greater than the first data retention duration.

Aspect 11: The apparatus of aspect 10, where the first trim setting is associated with a first temperature difference between one or more write operations and one or more read operations and the second trim setting is associated with a second temperature difference between one or more write operations and one or more read operations that is less than the first temperature difference.

Aspect 12: The apparatus of any of aspects 10 through 11, where transmitting the indication to initiate the second read operation is associated with a selected one of the first trim setting or the second trim setting, and where the controller is further configured to cause the apparatus to: transmit, to the memory device based at least in part on the decoding operation being unsuccessful, an indication to initiate a third read operation of the memory device in accordance with the other of the first trim setting or the second trim setting; and perform a second decoding operation based at least in part on receiving, from the memory device, third information that is associated with the third read operation of the memory device.

Aspect 13: The apparatus of aspect 12, where the controller is further configured to cause the apparatus to: perform a defect management operation based at least in part on the second decoding operation being unsuccessful.

Aspect 14: The apparatus of any of aspects 8 through 13, where to perform the decoding operation, the controller is configured to cause the apparatus to perform a hard bit decoding, a soft bit decoding, or any combination thereof.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed and second condition or action may at least partially occur as a result of the previous condition or action occurring (whether directly after or after one or more other intermediate conditions or actions occurring after the first condition or action).

Additionally, the terms "directly in response to" or "in direct response to" may refer to one condition or action occurring as a direct result of a previous condition or action. In some examples, a first condition or action may be performed and second condition or action may occur directly as a result of the previous condition or action occurring independent of whether other conditions or actions occur. In some examples, a first condition or action may be performed and second condition or action may occur directly as a result of the previous condition or action occurring, such that no other intermediate conditions or actions occur between the earlier condition or action and the second condition or action or a limited quantity of one or more intermediate steps or actions occur between the earlier condition or action and the second condition or action. Any condition or action described herein as being performed "based on," "based at least in part on," or "in response to" some other step, action, event, or condition may additionally or alternatively (e.g., in an alternative example) be performed "in direct response to" or "directly in response to" such other condition or action unless otherwise specified.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
a memory device; and
a controller coupled with the memory device and configured to cause the apparatus to:
identify a read error based at least in part on receiving, from the memory device, first information that is associated with a first read operation of the memory device;
select a trim setting from a plurality of trim settings based at least in part on identifying a data retention condition associated with the first information;
transmit, to the memory device, an indication to initiate a second read operation of the memory device in accordance with the selected trim setting; and
perform a decoding operation based at least in part on receiving, from the memory device, second information that is associated with the second read operation of the memory device.

2. The apparatus of claim 1, wherein the controller is further configured to cause the apparatus to:
receive an indication of a threshold voltage shift associated with a physical address of the memory device for the first read operation; and
identify the data retention condition based at least in part on the threshold voltage shift.

3. The apparatus of claim 1, wherein, to select the trim setting, the controller is configured to cause the apparatus to:
select between a first trim setting that is associated with a first data retention duration and a second trim setting that is associated with a second data retention duration that is greater than the first data retention duration.

4. The apparatus of claim 3, wherein the first trim setting is associated with a first temperature difference between one or more write operations and one or more read operations and the second trim setting is associated with a second temperature difference between one or more write operations and one or more read operations that is less than the first temperature difference.

5. The apparatus of claim 3, wherein transmitting the indication to initiate the second read operation is associated with a selected one of the first trim setting or the second trim setting, and wherein the controller is further configured to cause the apparatus to:
   transmit, to the memory device based at least in part on the decoding operation being unsuccessful, an indication to initiate a third read operation of the memory device in accordance with the other of the first trim setting or the second trim setting; and
   perform a second decoding operation based at least in part on receiving, from the memory device, third information that is associated with the third read operation of the memory device.

6. The apparatus of claim 5, wherein the controller is further configured to cause the apparatus to:
   perform a defect management operation based at least in part on the second decoding operation being unsuccessful.

7. The apparatus of claim 1, wherein to perform the decoding operation, the controller is configured to cause the apparatus to perform a hard bit decoding, a soft bit decoding, or any combination thereof.

8. A non-transitory computer-readable medium storing code comprising instructions which, when executed by a processor of an electronic device, cause the electronic device to:
   identify a read error based at least in part on receiving, from a memory device, first information that is associated with a first read operation of the memory device;
   select a trim setting from a plurality of trim settings based at least in part on identifying a data retention condition associated with the first information;
   transmit, to the memory device, an indication to initiate a second read operation of the memory device in accordance with the selected trim setting; and
   perform a decoding operation based at least in part on receiving, from the memory device, second information that is associated with the second read operation of the memory device.

9. The non-transitory computer-readable medium of claim 8, wherein the instructions, when executed by the processor of the electronic device, further cause the electronic device to:
   receive an indication of a threshold voltage shift associated with a physical address of the memory device for the first read operation; and
   identify the data retention condition based at least in part on the threshold voltage shift.

10. The non-transitory computer-readable medium of claim 8, wherein, to select the trim setting, the instructions, when executed by the processor of the electronic device, cause the electronic device to select between a first trim setting that is associated with a first data retention duration and a second trim setting that is associated with a second data retention duration that is greater than the first data retention duration.

11. The non-transitory computer-readable medium of claim 10, wherein the first trim setting is associated with a first temperature difference between one or more write operations and one or more read operations and the second trim setting is associated with a second temperature difference between one or more write operations and one or more read operations that is less than the first temperature difference.

12. The non-transitory computer-readable medium of claim 10, wherein transmitting the indication to initiate the second read operation is associated with a selected one of the first trim setting or the second trim setting, and wherein the instructions, when executed by the processor of the electronic device, further cause the electronic device to:
   transmit, to the memory device based at least in part on the decoding operation being unsuccessful, an indication to initiate a third read operation of the memory device in accordance with the other of the first trim setting or the second trim setting; and
   perform a second decoding operation based at least in part on receiving, from the memory device, third information that is associated with the third read operation of the memory device.

13. The non-transitory computer-readable medium of claim 12, wherein the instructions, when executed by the processor of the electronic device, further cause the electronic device to perform a defect management operation based at least in part on the second decoding operation being unsuccessful.

14. The non-transitory computer-readable medium of claim 8, wherein to perform the decoding operation, the instructions, when executed by the processor of the electronic device, cause the electronic device to perform a hard bit decoding, a soft bit decoding, or any combination thereof.

15. A method at a controller, the method comprising:
   identifying a read error based at least in part on receiving, from a memory device, first information that is associated with a first read operation of the memory device;
   selecting a trim setting from a plurality of trim settings based at least in part on identifying a data retention condition associated with the first information;
   transmitting, to the memory device, an indication to initiate a second read operation of the memory device in accordance with the selected trim setting; and
   performing a decoding operation based at least in part on receiving, from the memory device, second information that is associated with the second read operation of the memory device.

16. The method of claim 15, further comprising:
   receiving an indication of a threshold voltage shift associated with a physical address of the memory device for the first read operation; and
   identifying the data retention condition based at least in part on the threshold voltage shift.

17. The method of claim 15, wherein selecting the trim setting comprises:
   selecting between a first trim setting that is associated with a first data retention duration and a second trim setting that is associated with a second data retention duration that is greater than the first data retention duration.

18. The method of claim 17, wherein the first trim setting is associated with a first temperature difference between one or more write operations and one or more read operations and the second trim setting is associated with a second temperature difference between one or more write operations and one or more read operations that is less than the first temperature difference.

19. The method of claim 17, wherein transmitting the indication to initiate the second read operation is associated with a selected one of the first trim setting or the second trim setting, the method further comprising:
   transmitting, to the memory device based at least in part on the decoding operation being unsuccessful, an indication to initiate a third read operation of the memory device in accordance with the other of the first trim setting or the second trim setting; and performing a second decoding operation based at least in part on receiving, from the memory device, third information that is associated with the third read operation of the memory device.

20. The method of claim 19, further comprising:
performing a defect management operation based at least in part on the second decoding operation being unsuccessful.

21. The method of claim 15, wherein performing the decoding operation comprises performing a hard bit decoding, a soft bit decoding, or any combination thereof.

* * * * *